USi005969336A

United States Patent [19]
Streil et al.

[11] Patent Number: 5,969,336
[45] Date of Patent: Oct. 19, 1999

[54] RADIATION SENSOR ARRANGEMENT FOR DETECTING THE FREQUENCY OF RADIATION IMPINGING THEREON

[75] Inventors: Thomas Streil, Dresden; Roland Klinke, Dortmund, both of Germany

[73] Assignee: Sarad Gesellschaft Für Komplexe Leistungen Zur Sanierung Radiologisch Belasteter Objekte MbH, Freital, Germany

[21] Appl. No.: 08/913,643

[22] PCT Filed: Mar. 13, 1996

[86] PCT No.: PCT/EP96/01074

§ 371 Date: Nov. 10, 1997

§ 102(e) Date: Nov. 10, 1997

[87] PCT Pub. No.: WO96/29820

PCT Pub. Date: Sep. 26, 1996

[30] Foreign Application Priority Data

Mar. 20, 1995 [DE] Germany .............................. 195 10 070

[51] Int. Cl.$^6$ ...................................................... H01J 40/14
[52] U.S. Cl. .................................. 250/214 R; 250/214 LS
[58] Field of Search ........................ 250/214 R, 214 LA, 250/214 LS, 214.1, 208.1; 257/229, 230; 348/311–314, 297–299; 356/221–222

[56] References Cited

U.S. PATENT DOCUMENTS 4,764,814  8/1988  Endo et al. .
5,243,177  9/1993  Fujimagari et al. .................. 250/208.1

FOREIGN PATENT DOCUMENTS

4118154A1  12/1992  Germany .
4224358C1  10/1993  Germany .

OTHER PUBLICATIONS

Miwada, et al.; "TP11.2: A 100 MHz Data–Rate, 5000–Element CCD Linear Image Sensor with Reset Pulse Level Adjustment Circuit"; Feb. 1992; IEEE International Solid–State Circuits Conference.

*Primary Examiner*—Que T. Le
*Attorney, Agent, or Firm*—Duft, Graziano & Forest, P.C.

[57] ABSTRACT

A radiation sensor means for detecting a radiation comprises a radiation sensor element outputting a current which is generated by the incident radiation power, a detection circuit detecting the current generated by the radiation sensor element, and a reset circuit connected to the radiation sensor element in such a way that, when said reset circuit is driven by a reset signal, the charge carriers produced by the incident radiation power recombine at a rate which is higher than the rate without the reset signal, the reset signal being adapted to be applied to said reset circuit by means of the detection circuit.

13 Claims, 6 Drawing Sheets

RADIATION SENSOR ARRANGEMENT FOR DETECTING THE FREQUENCY OF RADIATION IMPINGING THEREON

FIELD OF THE INVENTION

The present invention refers to a radiation sensor means, and especially to a radiation sensor means for detecting how often radiation falls on said sensor means.

BACKGROUND OF THE INVENTION

The prior art already discloses radiation sensor means which are used e.g. for detecting a quantum radiation. A disadvantage of such sensors is that special problems arise in connection with the detection of radiations occurring comparatively rarely and as punctiform radiation. Due to the low occurrence probability, a large sensor surface is necessary so as to be able to detect the events. On the other hand, the punctiform event is averaged by the large surface, the sensors lose sensitivity and the signal-to-noise ratio deteriorates.

This problem can be solved by using a plurality of individual elements which are arranged in a matrix.

However, also this type of arrangement of the individual elements in a matrix entails essential problems. These problems arise when the matrix elements are read, which detect the punctiform radiation occurring with little probability. Due to so-called systematic addressing, a complete addressing cycle of the whole matrix is required in each individual case. The result obtained is the address as well as the value of the active matrix element, which is normally referred to as pixel.

A special disadvantage arises in cases of use where only the events are detected, i.e. where it is only detected how often radiation falls on the sensor. In this case, a very high percentage of the information supplied by this kind of addressing cannot be utilized.

A further problem arising in connection with these cases of use is that the reaction velocity of individual sensor elements may exceed by far the system clock for the whole sensor element matrix. Reaction velocity means, in this connection, the velocity with which the charge carriers generated by the incident radiation are decomposed in the radiation sensor element. This decomposition is normally referred to as recombination. A problem arises in the case of a renewed pass of the system clock, if the reaction time of the sensor, which is determined by the reaction velocity, has not yet elapsed after a previous incidence of radiation. In this case, the sensor will output a signal with regard to which it is not known whether it has been generated by new radiation falling on the sensor or by not yet fully recombined charge carriers.

DE-4224358 C1 describes a radiation sensor means having a high sensitvity and a high dynamic range and serving to detect quantum radiation. When such a known radiation sensor means is used for detecting how often a radiation falls on said sensor, the above described problems with regard to the reaction velocity and with regard to the system clock arise when said radiation sensor means are read.

DE 41 18 154 A1 describes an array comprising a sensor matrix and a reset arrangement. This known array comprises a plurality of sensors which are arranged in a matrix and which are sensitive to light and X-rays, respectively, said sensors generating charges in response to the incident amount of radiation. Each of the sensors comprises an electric switch. The arrangement is provided with a switching line for each line of sensors, which is adapted to be used for activating the individual switches so that the charges generated will flow off through associated read-out lines. For eliminating residual charges after a read-out operation, the array comprises a reset arrangement activating the sensors after the read-out operation via the read-out line thereof, whereby the electric switches of the sensors are rendered conducting and the residual charges, which are stored in the sensors after the previous read-out operation, flow off via the associated read-out lines. After a predetermined number of clocks of a reset clock, the respective read-out lines are deactivated again.

SUMMARY OF THE INVENTION

Starting from this prior art, it is the object of the present invention to further develop a radiation sensor means in such a way that this radiation sensor means has a better reaction velocity.

This object is achieved by a radiation sensor means for detecting a radiation incident thereon, comprising at least one radiation sensor element outputting a current which is generated by the incident radiation power; and a detection circuit detecting the current generated by the radiation sensor element; wherein the radiation sensor element is a transistor having a gate, a source, a drain and a substrate terminal; and the radiation sensor means comprises a reset circuit, which, when it has a reset signal applied thereto, establishes a connection between the substrate terminal and the source terminal of the transistor so that the charge carriers produced by the incident radiation power recombine at a rate which is higher than the rate without the reset signal, the reset signal being adapted to be applied to said reset circuit by means of the detection circuit.

The present invention provides a radiation sensor means for detecting how often a radiation falls on said sensor means, comprising at least one radiation sensor element outputting a current which is generated by the incident radiation power; and a detection circuit detecting the current generated by the radiation sensor element; a reset circuit being provided, which is connected to the radiation sensor element in such a way that, when said reset circuit is driven by a reset signal, the charge carriers produced by the incident radiation power recombine at a rate which is higher than the rate without the reset signal, the reset signal being adapted to be applied to said reset circuit by means of the detection circuit.

According to an adavantageous further development of the present invention, the individual matrix elements are reset depending on the read-out result and the number of matrix elements addressed. This is achieved by a sensor means in the case of which the detection circuit has the following features: a capacitor connected between an output of the radiation sensor element and ground; a switch bridging the capacitor in its closed condition; a buffer whose input is connected to the output of the radiation sensor element; an analog-digital converter whose input is connected to the output of the buffer; a logic circuit comprising an input and three outputs, said logic circuit having its input connected to the output of the analog-digital converter and producing the reset signal at the first and second outputs in response to the signals applied to the input, and an output signal at the third output, the first output being connected to the reset circuit and the second output to the switch; and a flag storage means connected to the third output of the logic circuit, said flag storage means setting a status of a flag depending on the output signal of said logic circuit and on a comparison between a preceding value of the output signal and the output signal applied, and storing said status of the flag.

According to a further preferred embodiment, the present invention provides intelligent addressing achieved by a radiation sensor means in the case of which the detection circuit has the following features: a first means which is connected between an output of the radiation sensor element and ground and which connects to ground a first signal supplied by the radiation sensor element and having a first level, said first means blocking a second signal supplied by the radiation sensor element and having a second level, and said second level being higher than said first level; a second means which is connected to the output of the radiation sensor element and which blocks the first signal and allows the second signal to pass; and a buffer connected to the output of said second means, the output of said buffer being connected to an output of the detection circuit.

Further preferred embodiments of the present invention are defined in the subclaims.

BRIEF DESCRIPTION OF THE DRAWINGS

In the following, preferred embodiments of the present invention will be explained in detail making reference to the drawings enclosed, in which.

DESCRIPTION OF PREFERRED EMBODIMENTS OF THE INVENTION

On the basis of FIG. 1, a first embodiment of the present invention will be described in detail hereinbelow.

Figure 1:
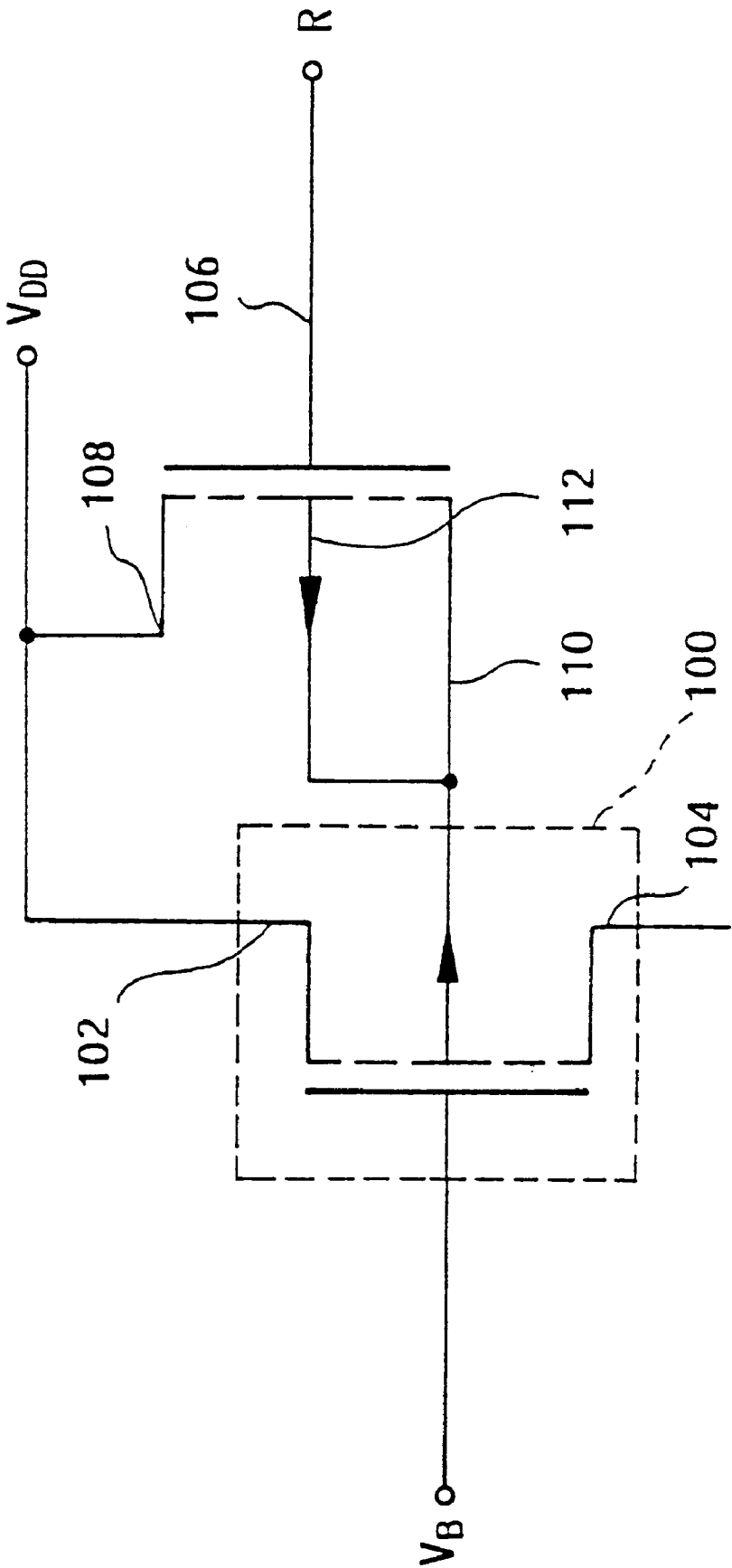
FIG. 1 shows a first embodiment of the radiation sensor means according to the present invention.

The sensor means shown in FIG. 1 comprises a radiation sensor element designated generally by reference numeral 100. In the embodiment shown in FIG. 1, this radiation sensor element 100 is e.g. an MOS transistor having a so-called floating well.

It is apparent that the present invention is not limited to radiation sensor elements of this type, but that a large number of radiation sensor elements can be used, such as a JFET or an SOI transistor.

The drain-source current of the transistor 100 is substantially proportional to the incident radiation power. A source terminal 102 of the transistor 100 has applied thereto a supply potential $V_{DD}$, whereas the operating point of the transistor can be adjusted via an operating-point adjustment voltage $V_B$. The signal generated by the transistor 100 can be tapped at a drain terminal 104 of said transistor 100.

The output signal tapped at said drain terminal 104 is supplied to a detection circuit (not shown in FIG. 1) used for detecting and for further processing the current generated by the radiation sensor element.

The radiation sensor means shown in FIG. 1 comprises a reset circuit in addition to the transistor 100, said reset circuit being an FET switch in the embodiment shown in FIG. 1.

The FET switch comprises a gate terminal 106, a source terminal 108, a drain terminal 110 and a substrate terminal 112 connected to said drain terminal 110.

The source terminal 108 has applied thereto the supply potential $V_{DD}$.

The gate terminal 106 is adapted to have applied thereto a reset signal R generated by the detection circuit (not shown).

When the reset signal is applied to the gate of the FET switch, said FET switch is rendered conducting so that the charge carriers produced in the radiation sensor element by the incident radiation power recombine at a rate which is higher than the rate that would exist without any reset signal.

By means of this increase in the recombination rate in the radiation sensor element, the reaction velocity of the radiation sensor element can be improved so that the reaction time will decrease.

If the radiation sensor element 100 is an MOS transistor with a floating well, the reset circuit can be arranged in said well, whereby the advantage is achieved that the reset circuit does not constitute a part of the active area of the radiation sensor means.

The present invention is not limited to an FET switch, but, essentially, it is possible to use any type of reset circuit by means of which the recombination rate can be increased by applying a reset signal in comparison with the recombination rate existing when no reset signal is applied.

Although FIG. 1 only shows one radiation sensor element with a reset circuit, it is apparent that the invention is not limited to this individual element alone, but that it comprises also the interconnection of a plurality of such radiation sensor elements including a reset circuit in a matrix.

Figure 2:
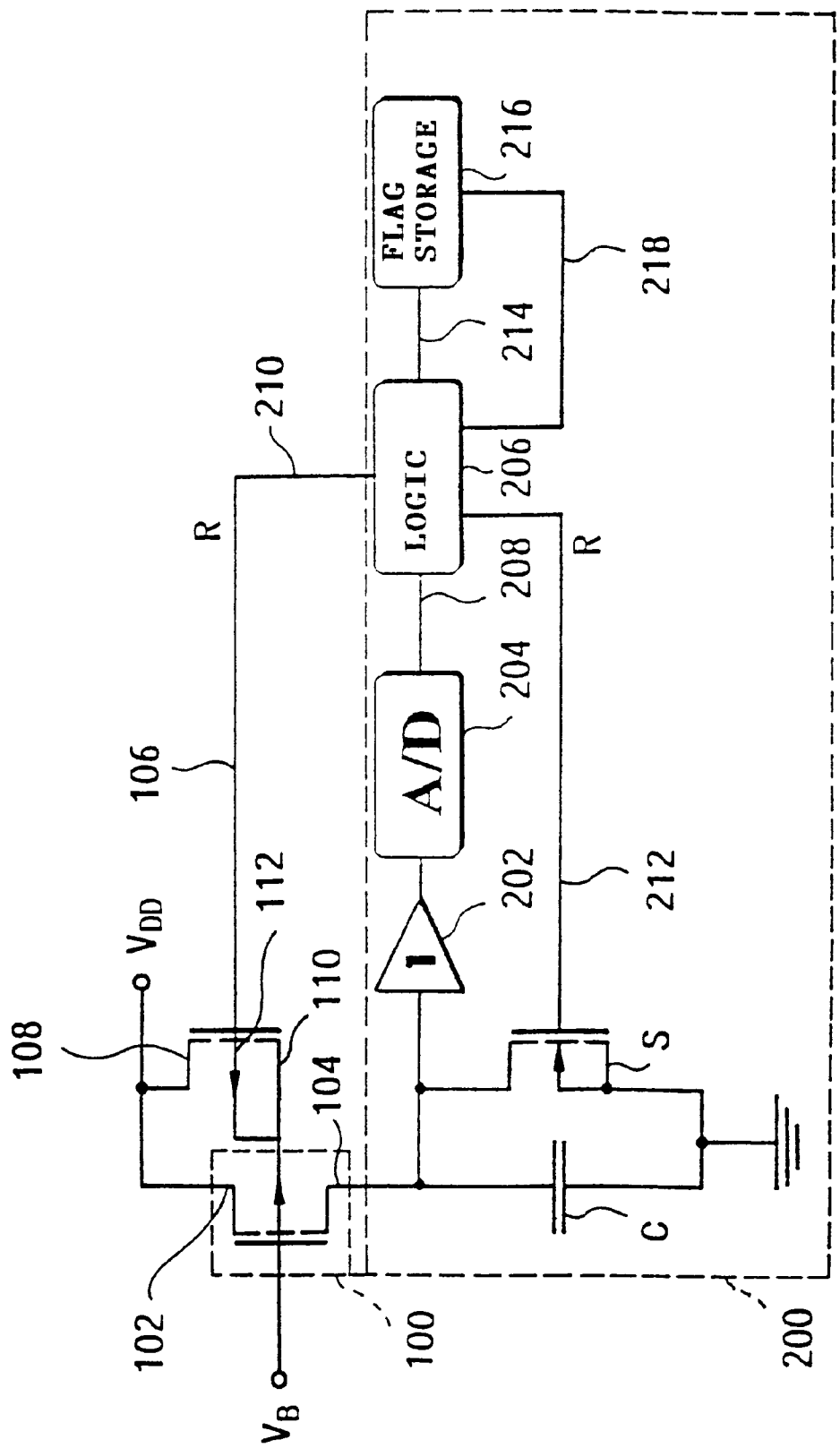
FIG. 2 shows a second embodiment of the radiation sensor means according to the present invention.

In FIG. 2 a further embodiment of the present invention is described, identical reference numerals being used for elements which have already been shown in FIG. 1. These elements are not described again.

In addition to the radiation sensor element 100 which includes a reset circuit and which has already been described on the basis of FIG. 1, FIG. 2 shows an embodiment of a detection circuit designated generally by reference numeral 200.

This detection circuit 200 comprises a capacitor C connected between the output 104 of the radiation sensor element 100 and ground. A switch S is connected in parallel with the capacitor C and bridges said capacitor C in its closed condition. In the embodiment shown in FIG. 2, said switch S is an FET switch which is known per se. This FET switch is only shown by way of example; it is easily possible to use other switch means instead of the FET switch.

The output 104 of the radiation sensor element 100 is connected to an input of a buffer 202 whose output is connected to the input of an analog-digital converter 204. A logic circuit 206 comprises an input 208, which is connected to the output of the analog-digital converter 204, and three outputs 210, 212 and 214. Depending on the signals applied to said input 208, the logic circuit 206 generates the reset signal R at the first output 210 and at the second output 212. The output 210 of the logic circuit 206 is connected to the gate terminal 106 of the reset circuit, and the output 212 of the logic circuit 206 is connected to the gate terminal of the switch S. The logic circuit 206 generates at its third output 214 an output signal which is inputted in a flag storage 216. Depending on the output signal of the logic circuit 206 applied to the line 214 and depending on a comparison between a preceding value of the output signal and the output signal applied, a status of a flag in the flag storage 216 is set and stored. The comparison with a preceding value of the output signal is carried out via line 218 which connects an output of the flag storage with a further input of the logic circuit 206.

The logic circuit 206 is effective in such a way that the matrix element (pixel) is only reset if the result is valid or if the pixel in the preceding cycle has not been reset. The table following hereinbelow elucidates the algorithm used:

TABLE 1

| result of the A/D conversion | old value of read-out flag | new value of read-out flag | result |
| --- | --- | --- | --- |
| minimum or maximum | arbitrary | 0 | valid |
| other digital word | 0 | 1 | unvalid |
| other digital word | 1 | 0 | valid |

By means of this algorithm, it is achieved that, independently of the occurrence of an event—radiation falling on a sensor element—at least one system period elapses. Hence, a multilation of the result need not be expected.

On the basis of FIG. 3, a third embodiment of the present invention will be described hereinbelow. Elements which have already been described on the basis of FIG. 1 are here again designated by the same reference numerals, and these elements will not be described again.

Figure 3:
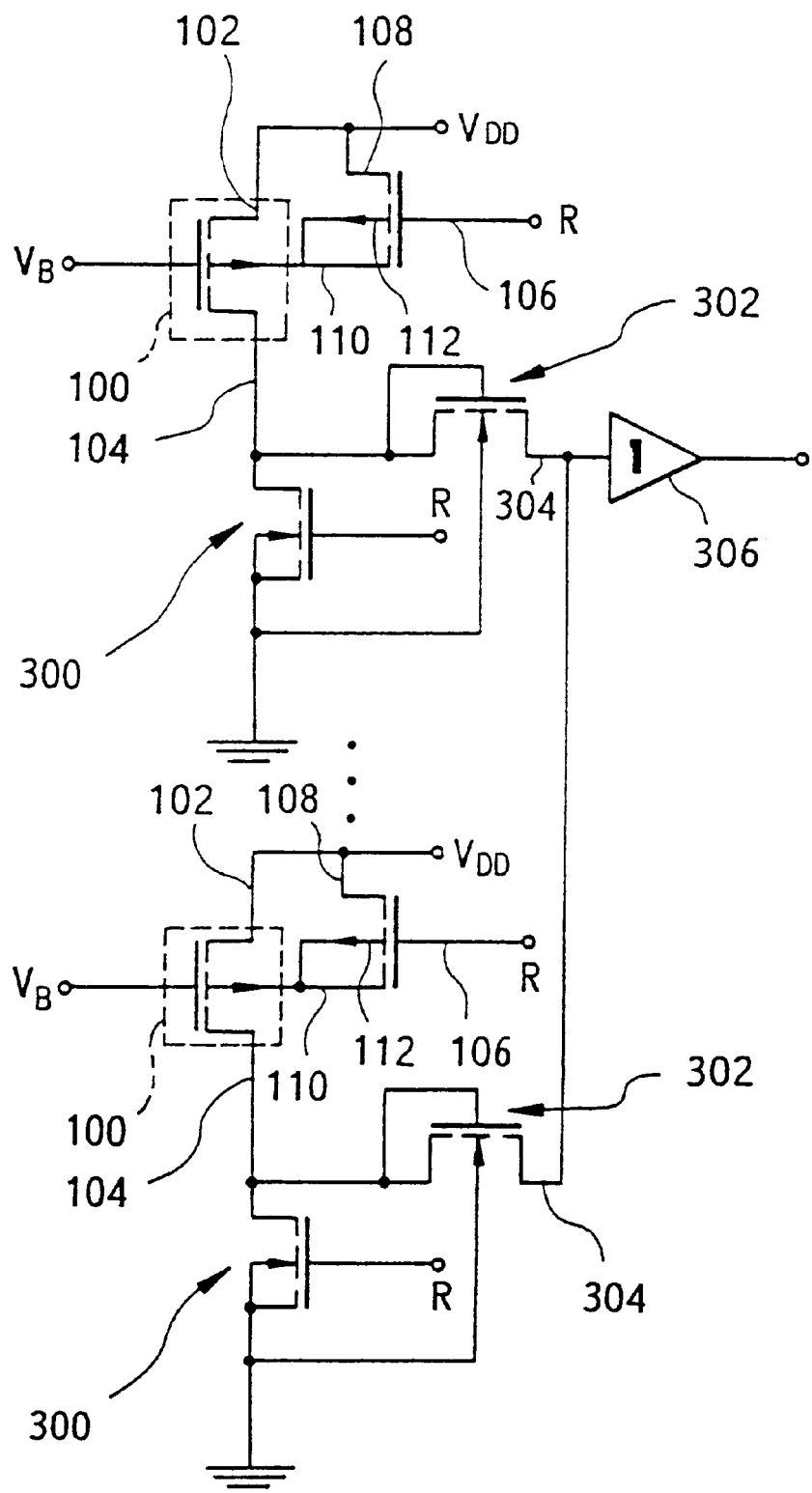
FIG. 3 shows a third embodiment of the radiation sensor means according to the present invention.

FIG. 3 shows a so-called intelligent addressing due to which addressing on the chip surface can be saved. The advantage is that it is essentially only active area that remains on the sensor surface. In FIG. 3, part of a detection circuit is shown.

Although two radiation sensor elements with the respective detection circuits are shown in FIG. 3, only one of these detection circuits will be described, since the said detection circuits are identical.

The detection circuit in FIG. 3 comprises a first transistor 300 connected between the output of the radiation sensor element 104 and ground, and a second transistor 302 connected to the output 104 of the radiation sensor element.

The transistors 300, 302 guarantee that, during the reset phase, the signals at the output 104 of the radiation sensor element 100 are connected to ground.

During the measurement phase, precisely the signal having the highest level will appear at the output 304.

The embodiment shown in FIG. 3 comprises a plurality of such detection circuits whose respective outputs 304 are connected to the input of a buffer 306 whose output is connected to a further part of the detection circuit, which is not shown.

Via this detection circuit, which is not shown, a reset signal can be applied to the first transistor.

By means of this intelligent addressing, it is possible that the pixel having applied thereto the signal always determines the output signal. As soon as a value has been read out or a predetermined time has elapsed, the reset signal is outputted.

In the embodiment shown in FIG. 3, it is no longer necessary to address each pixel individually.

The first transistor 300 is implemented as NMOS transistor whose source is connected to the output 104 of the radiation sensor element 100, whose drain is connected to ground, and whose gate is adapted to have applied thereto the reset signal. The second transistor 302 is an NMOS transistor connected in a so-called diode connection.

It is apparent that, in addition to the NMOS transistors which have just been described, also other circuit elements can be used for realizing the first transistor 300 and the second transistor 302.

On the basis of FIG. 4, a fourth embodiment of the present invention will be described hereinbelow. In this fourth embodiment, the elements which have already been described making reference to FIG. 1 are again designated by the same reference numerals; these elements will not be described again.

Figure 4:
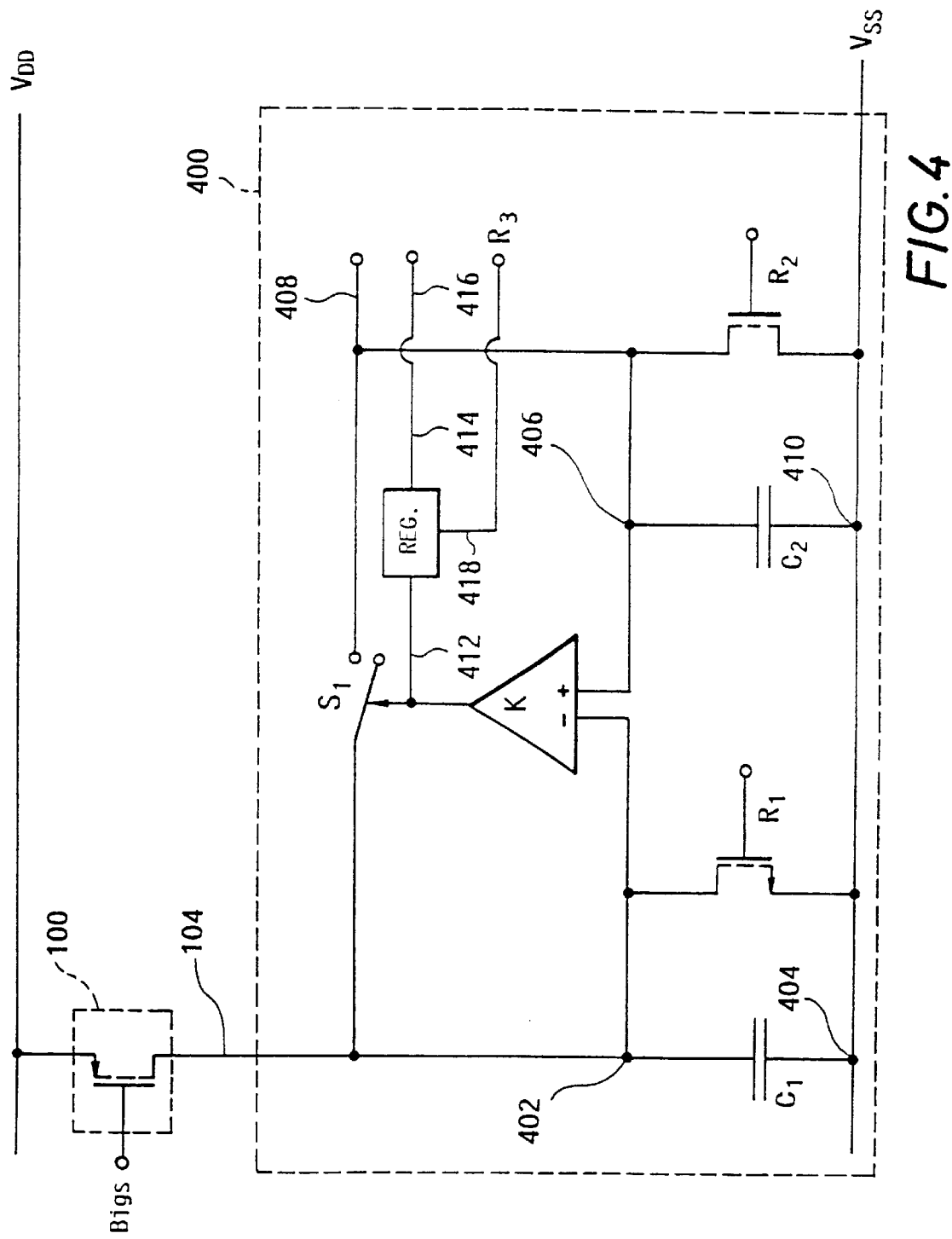
FIG. 4 shows a fourth embodiment of the radiation sensor means according to the present invention.

The detection circuit 400 in the embodiment according to FIG. 4 comprises a first storage capacitor $C_1$ whose first terminal 402 is connected to the output 104 of the radiation sensor element 100 and whose second terminal 404 is connected to a power supply $V_{ss}$.

A first reset switch $R_1$ is connected in parallel with said first storage capacitor.

The detection circuit 400 additionally comprises a second storage capacitor $C_2$ whose first terminal 406 is connected to an output 408 of the detection circuit 400 and whose second terminal 410 is connected to the power supply $V_{ss}$.

A second reset switch $R_2$ is connected in parallel with said second storage capacitor.

The reset switches $R_1$ and $R_2$ are FET switches in this embodiment.

An inverting input of a comparator K is connected to the first terminal 402 of the first storage capacitor $C_1$, and a non-inverting input of the comparator K is connected to the first terminal 406 of the second storage capacitor $C_2$.

A switch $S_1$ is connected between the output 104 of the radiation sensor element 100 and the output 408 of the detection circuit 400. The switch is controlled by a signal at the output of the comparator K and connects in its closed condition the output 104 and the output 408.

The output of the comparator is connected to an input 412 of a register REG. An output 414 of the register REG is connected to a read-out terminal 416 of the detection circuit 400. A reset input 418 of the register REG is connected to a reset input $R_3$.

In the following, the mode of operation of the detection circuit 400 will be described in detail.

At a $t_0$, an output signal of the radiation sensor element 100 is stored on the storage capacitor $C_2$. Subsequently, the radiation sensor element 100 is reset.

During the measurement period, the output signal of the radiation sensor element 100 is stored on the storage capacitor $C_1$.

When the measurement period has been finished, the storage capacitor $C_1$ is discharged by means of the first reset switch $R_1$.

By means of the comparator, the voltages at the storage capacitors $C_1$ and $C_2$ are compared. If the voltage at the storage capacitor $C_1$ is higher than that at the storage capacitor $C_2$, a signal will be produced at the output of the comparator.

This signal has the effect that the switch $S_1$, closes, said switch $S_1$ being open at the beginning of the measurement period. At the same time, a read-out bit is written into the register REG.

If the voltage at the storage capacitor $C_1$ is lower than that at the storage capacitor $C_2$, no signal will be produced at the output of the comparator, the switch $S_1$ will remain open and no read-out bit will be written into the register REG.

The reading from the detection circuit 400 is only carried out if the read-out bit is set. When the read-out has been finished, the read-out bit is reset by a reset signal applied to the reset terminal $R_3$. The read-out is controlled by a processing circuit (not shown) which is arranged at the output 408 of the detection circuit 400.

When the measurement period has been finished, both storage capacitors are reset by means of the reset switches $R_1$ and $R_2$ before a new measurement is carried out.

On the basis of FIG. 5a and 5b, a fifth and a sixth embodiment of the present invention will be described hereinbelow. Elements which have already been described on the basis of FIG. 1 are designated by the same reference numerals, and these elements will not be described again.

Figure 5A:
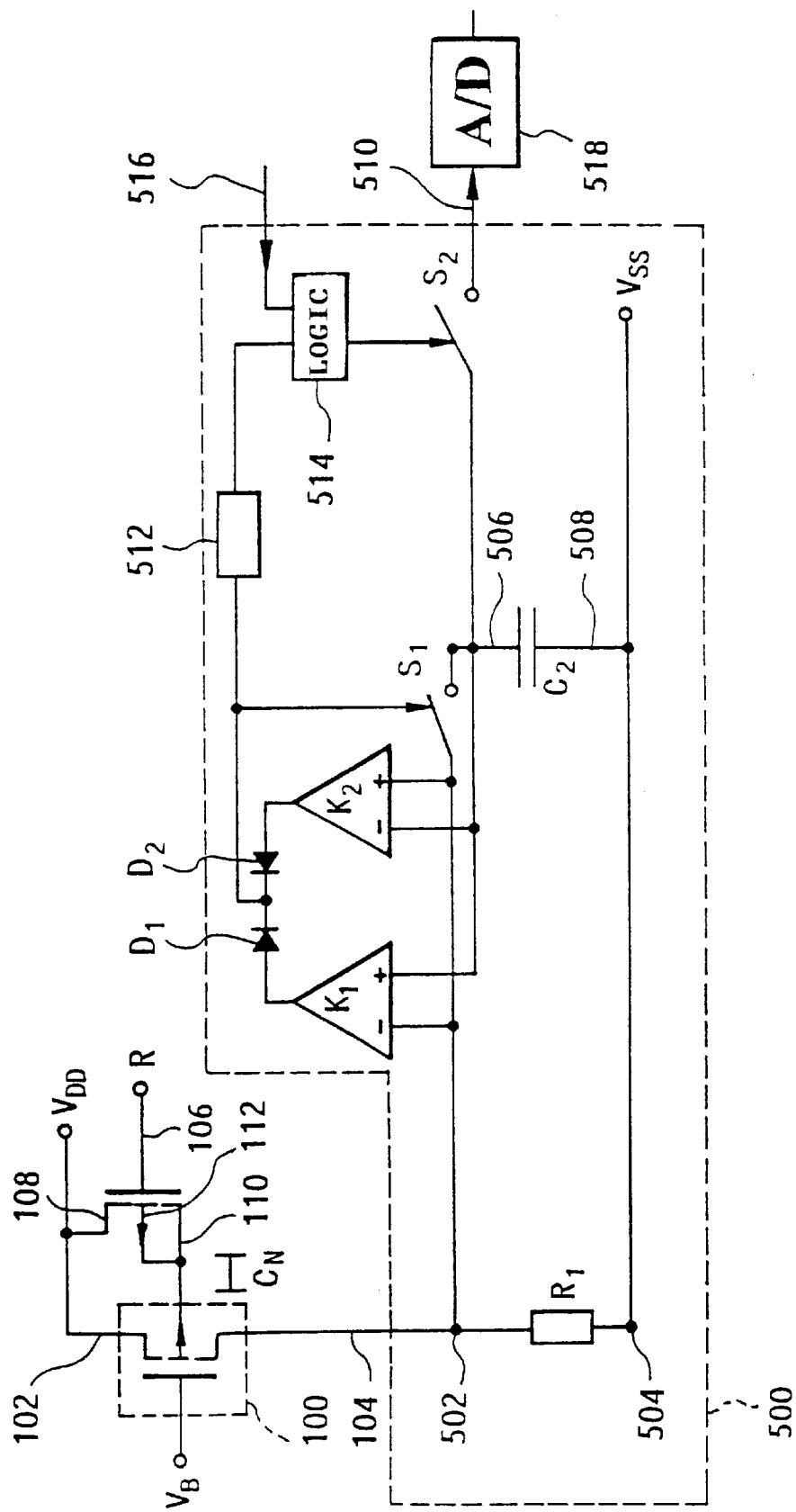
FIG. 5a and 5b show a fifth and a sixth embodiment of the radiation sensor means according to the present invention.
Figure 5B:
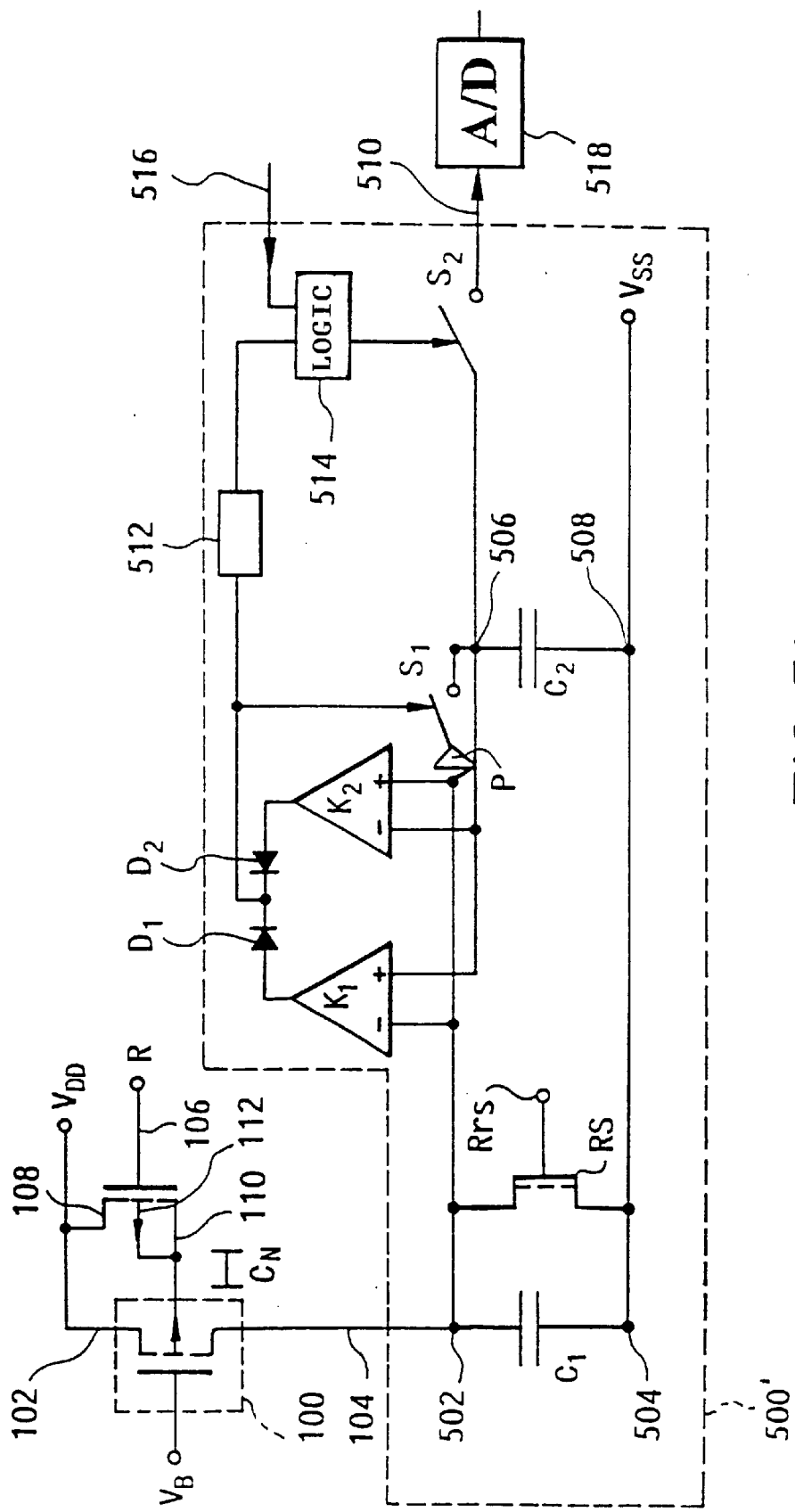

In the fifth and sixth embodiments, the self-capacitance $C_n$ of the radiation sensor element 100 is used for storing the radiation falling on said radiation sensor element 100, as can be seen in FIG. 5a and 5b.

In the embodiments shown in FIG. 5a and 5b, this self-capacitance $C_n$ is the N-well capacitance of the P-MOS phototransistor. The charges collected in the N-well, which are generated by the radiation, produce a proportional drain-source current (charge-current conversion).

The detection circuit 500 of the embodiment shown in FIG. 5a comprises a resistor $R_1$ whose first terminal 502 is connected to the output 104 of the radiation sensor element and whose second terminal 504 is connected to a power supply $V_{ss}$.

The resistor $R_1$ has its first terminal 502 connected to an inverting terminal of a first comparator $K_1$ and to a non-inverting terminal of a second comparator $K_2$. The first terminal 502 of the resistor $R_1$ is connected to a first terminal 506 of a storage capacitor $C_2$ via a first switch $S_1$.

The storage capacitor $C_2$ is provided with a second terminal 508 connected to the power supply $V_{ss}$.

The storage capacitor $C_2$ has its first terminal 506 connected to a non-inverting terminal of the comparator $K_1$ and to an inverting terminal of the comparator $K_2$.

The storage capacitor $C_2$ has its first terminal 506 connected to an output 510 of the detection circuit 500 via a second switch $S_2$.

The outputs of the comparators $K_1$, $K_2$ are interconnected via two diodes $D_1$ and $D_2$. Between said diodes $D_1$ and $D_2$, the output signal of the comparators $K_1$, $K_2$ can be tapped. By means of this output signal, the first switch $S_1$ can be controlled.

Via a delay circuit 512 and a logic circuit 514, the output signal of the comparators $K_1$, $K_2$ can be applied to the second switch $S_2$ for controlling said switch. The logic circuit 514 has supplied thereto an external control signal via a terminal 516.

The output of the detection circuit is connected to a data bus (not shown) via an analog-digital converter 518.

In the following, a short description of the mode of operation of the embodiment shown in FIG. 5a will be given.

The current produced by the radiation sensor element 100 is registered at the resistor $R_1$ as voltage drop. The double comparator $K_1$, $K_2$ compares the voltages at the resistor $R_1$ and at the storage capacitor $C_2$. If the two voltages are equal, the first switch $S_1$ will not be closed and the second switch $S_2$ will not have supplied thereto any output signal for pulse amplitude processing.

If the voltage is higher or lower than the comparator difference set, the first switch $S_1$ will be closed and the storage capacitor $C_2$ will be charged to the potential across the resistor $R_1$. With a short delay, until the charging process has been finished, the output signal is supplied to the analog-digital converter 518 and the data bus via the second switch $S_2$.

When the A/D conversion has been finished, the second switch $S_2$ and the first switch $S_1$ are opened and the storage capacitor $C_2$ stores the charge.

The radiation sensor element 100 and its self-capacitance $C_n$ are then reset.

This process takes place during a defined clock cycle.

The sixth embodiment shown in FIG. 5b essentially corresponds to the embodiment shown in FIG. 5a.

Instead of the resistor $R_1$, a first storage capacitor $C_1$ is used in the detection circuit 500' according to this embodiment; a reset switch RS, which is adapted to have applied thereto a reset signal $R_{rs}$, is connected in parallel with said first storage capacitor $C_1$.

In addition, a buffer P is provided between the non-inverting input of the comparator $K_2$ and the first switch $S_1$, said buffer P having a unity gain.

During the defined clock cycle, the first storage capacitor $C_1$ is charged by the flow of current resulting from the incident radiation. At defined time intervals, the charges on the first storage capacitor $C_1$ and the storage capacitor $C_2$ are compared.

If the two charges are equal, no output signal will be supplied to the output 510. In case an output signal should be demanded by a processing unit circuited behind the detection circuit 500', the output signal will be supplied to the output 510 by adequately driving the logic circuit 514, which will then close the second switch $S_2$.

If the charges are not equal, the switch $S_1$ will be closed and the charge will be recharged from the first storage capacitor $C_1$ to the storage capacitor $C_2$ via the buffer P and its low-ohmic output.

The storage capacitor $C_2$ is connected to the output of the detection circuit 500' by means of the second switch $S_2$ with a time delay after the end of the recharging process, said time delay being caused by the delay circuit 512.

When the clock cycle has been finished, the self-capacitance $C_n$ of the radiation sensor element 100 as well as the first storage capacitor $C_1$ are reset by means of the reset signals R and $R_{rs}$.

According to the fifth and sixth embodiments, the whole detection circuit 500, 500' can be accommodated in a cell, i.e. a pixel, of the radiation sensor means. The cell, i.e. the pixel, outputs varying radiation sensor signals for further processing and causes a dramatic data reduction in this way.

Due to the clock control and the chopped transmission of information, e.g. in the case of photon streams (light), it is possible to realize very large dynamic ranges. The incident photon stream corresponds to the number of photons per unit time.

Whereas known systems have integration times that are longer than >1 ms, the device according to the fifth and sixth embodiments, which permits time resolutions down to the $\mu s$ region, also allows a transmission of pulse amplitude information consisting of individual pulses and an integration of said pulse amplitude information in the subsequent processing system. This has the effect that a high dynamic range is achieved. Processing widths of up to 24 bits can then be realized in the processing unit, these processing widths corresponding to the full visible spectrum of light.

Which kind of dynamics is obtained can be determined by the processing carried out, by determining in the course of how many cycles the quantized pixel signal is put together into a data value in the processing unit. By means of this method, the A/D conversion is simplified very elegantly and a data reduction is achieved simultaneously.

The interface system between the pixel matrix and the processing unit is relieved in this way by several orders of magnitude with regard to the data stream.

New video systems with video frequencies for extremely fast events and for process control can be realized in this way. At the same time, diaphragm systems can be dispensed with because the dynamic range is high enough.

We claim:

1. A radiation sensor means for detecting a radiation incident thereon, comprising
    at least one radiation sensor element outputting a current which is generated by the incident radiation power; and
    a detection circuit detecting the current generated by the radiation sensor element; wherein
    the radiation sensor element is a transistor having a gate, a source, a drain and a substrate terminal; and
    the radiation sensor means comprises a reset circuit, which, when it has a reset signal applied thereto, establishes a connection between the substrate terminal and the source terminal of the transistor so that the charge carriers produced by the incident radiation power recombine at a rate which is higher than the rate without the reset signal, the reset signal being adapted to be applied to said reset circuit by means of the detection circuit.

2. A radiation sensor means according to claim 1, wherein the radiation sensor element is an MOS transistor with a floating well.

3. A radiation sensor means according to claim 1, wherein the radiation sensor element is an JFET.

4. A radiation sensor means according to claim 1, wherein the radiation sensor element is an SOI transistor.

5. A radiation sensor means according to claim 2, wherein the reset circuit is arranged in said well.

6. A radiation sensor means according to claim 1, wherein the reset circuit comprises an FET switch.

7. A radiation sensor means according to claim 1, wherein a self-capacitance of the radiation sensor element stores the charges generated by the incident radiation.

8. A radiation sensor means according to claim 1, wherein the detection circuit has the following features:
    a capacitor connected between an output of the radiation sensor element and ground;
    a switch bridging the capacitor in its closed condition;
    a buffer whose input is connected to the output of the radiation sensor element;
    an analog-digital converter whose input is connected to the output of the buffer;
    a logic circuit comprising an input and three outputs, said logic circuit having its input connected to the output of the analog-digital converter and producing the reset signal at the first and second outputs in response to the signals applied to the input and an output signal at the third output, the first output being connected to the reset circuit and the second output to the switch; and
    a flag storage means connected to the third output of the logic circuit, said flag storage means setting a status of a flag depending on the output signal of said logic circuit and on a comparison between a preceding value of the output signal and the output signal applied, and storing said status of the flag.

9. A radiation sensor means according to claim 8, wherein the switch is an FET switch.

10. A radiation sensor means according to claim 1, wherein the detection circuit has the following features:
    a first transistor connected between an output of the radiation sensor element and ground;
    a second transistor connected to the output of the radiation sensor element;
    said first and second transistors being interconnected such that, during the reset phase, a signal outputted by the radiation sensor element is connected to ground and that, during the measurement phase, the signal having the highest level is applied to the output; and
    a buffer connected to the output of the second transistor, the output of said buffer being connected to an output of the detection circuit.

11. A radiation sensor means according to claim 10, wherein the first transistor comprises an NMOS transistor whose source is connected to the output of the radiation sensor element, whose drain is connected to ground and whose gate is adapted to have applied thereto the reset signal; and
    that the second transistor is an NMOS transistor connected in a diode connection.

12. A radiation sensor means according to claim 1, wherein the detection circuit has the following features:
    a first storage capacitor whose first terminal is connected to the output of the radiation sensor element and whose second terminal is connected to a power supply;
    a first reset switch connected in parallel with said first storage capacitor;
    a second storage capacitor whose first terminal is connected to the output of the detection circuit and whose second output is connected to the power supply;
    a second reset switch connected in parallel with said second storage capacitor;
    a comparator having an output, the inverting input of said comparator being connected to the first terminal of the first storage capacitor and the non-inverting input of the said comparator being connected to the first terminal of the second storage capacitor;
    a switch which, at a first position, connects the output of the radiation sensor element to the output of the detection circuit when a signal is applied to the output of the comparator, and which, at its second position, separates the output from the output when no signal is applied to the output of the comparator; and
    a register whose input is connected to the output of the comparator and whose output is connected to a read-out terminal of the detection circuit, said register including a reset input, which is connected to a reset terminal of the detection circuit, and storing a read-out bit when a signal is applied to the output of the comparator, said read-out bit being reset when a reset signal is applied to the reset input of the register.

13. A radiation sensor means according to claim 12, wherein the reset switches are FET switches.

* * * * *